US005304747A

United States Patent [19]

Hale, II

[11] Patent Number: 5,304,747

[45] Date of Patent: Apr. 19, 1994

[54] SPEAKER WITH MOTOR-CONTROLLED INTERNAL BAFFLE

[76] Inventor: Richard L. Hale, II, Rte. 11, Box 530, Elizabethton, Tenn. 37643

[21] Appl. No.: 17,269

[22] Filed: Feb. 12, 1993

[51] Int. Cl.[5] .................................... H05K 5/00

[52] U.S. Cl. .................................... 181/156; 181/199; 381/159

[58] Field of Search ............... 181/143, 152, 154, 155, 181/156, 199; 381/90, 158, 159, 160

[56] References Cited

U.S. PATENT DOCUMENTS

| | | | |
|---|---|---|---|
| 3,047,090 | 7/1962 | Pruden | 181/143 |
| 3,385,394 | 5/1968 | Gundlach | 181/143 |
| 3,923,123 | 12/1975 | Latimer-Sayer | 181/156 XR |
| 3,961,684 | 6/1976 | Michael et al. | 181/143 |
| 5,170,436 | 12/1992 | Powell | 381/90 |

*Primary Examiner*—Michael L. Gellner
*Assistant Examiner*—Khanh Dang
*Attorney, Agent, or Firm*—S. Michael Bender

[57] ABSTRACT

An audio speaker in a cabinet is provided having an internal baffle movable on a track and driven by a motor. The movement of the internal baffle is controlled externally by controls mounted on the speaker cabinet. Selective movement of the internal baffle results in a change of the resonant frequency of the speaker/cabinet combination thereby selectively changing the characteristic of the reproduced sound.

6 Claims, 5 Drawing Sheets

FIG 3
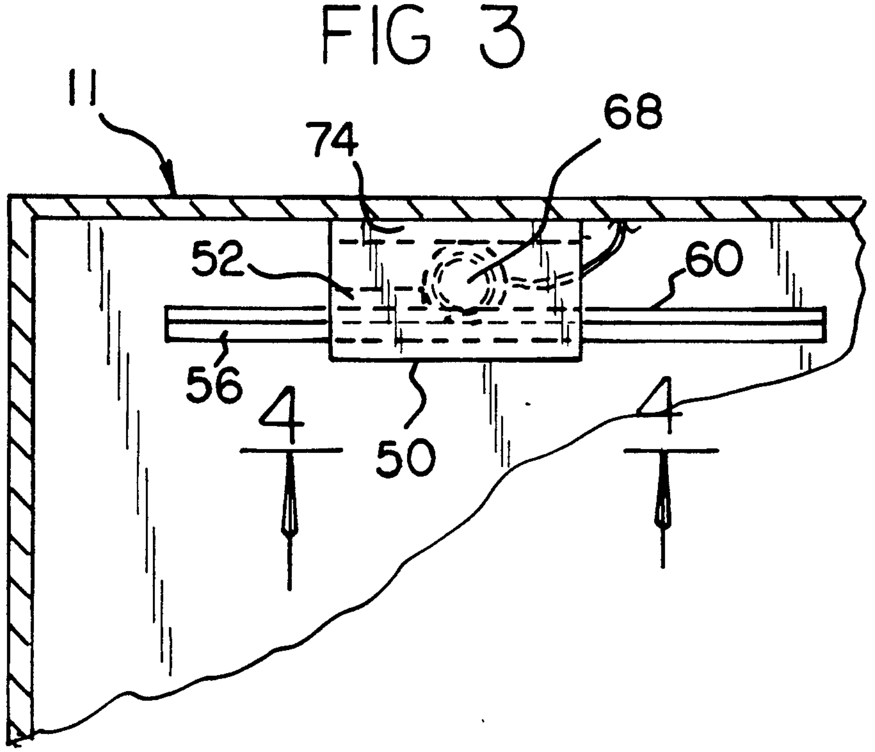
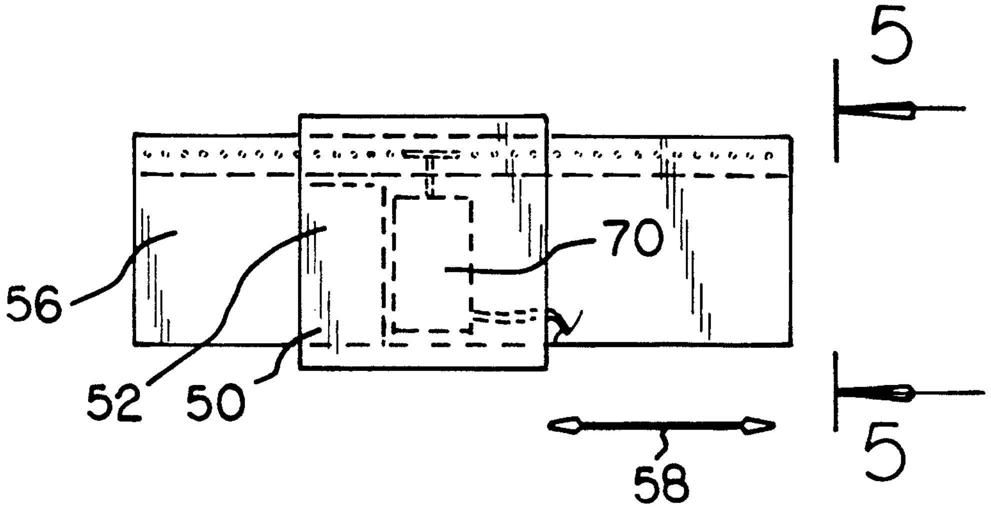
FIG 4

SPEAKER WITH MOTOR-CONTROLLED INTERNAL BAFFLE

BACKGROUND OF THE INVENTION

1. Field of the Invention

The present invention relates generally to audio speakers, and more particularly, to an audio speaker mounted in a cabinet and having means for altering the resonant frequency of the speaker/cabinet combination.

2. Description of the Prior Art

In an attempt to provide more accurate sound reproduction it is known to provide various means in an audio speaker cabinet to modify the resonant frequency of the cabinet. In one approach, a tube or port is placed in a sidewall of the cabinet to damp the system's resonant frequency and thereby provide smoother frequency response. In another solution, a high compliance speaker is mounted in a sealed enclosure (i.e. so-called "acoustic suspension"). In yet another solution, a tortuous path of fixed baffles is placed in the cabinet to provide separate paths for the sound radiated from the front and rear sides of a speaker cone. While these various constructions are effective to provide improved sound reproduction from a cabinet mounted speaker, they all suffer from certain disadvantages. For example, a speaker cabinet with a tuned port might sound adequate when reproducing certain kinds of music, but not others. The reason for this is that the tuning of the port cannot be adjusted depending upon the music being listened to. The same lack of flexibility is inherent in the air-suspension and column-loaded varieties mentioned above. It is evident, therefore, that a need exists for a speaker system comprising a speaker mounted in a cabinet wherein the cabinet includes means for adjusting the resonant frequency of the speaker/cabinet combination selectively and whenever desired by a listener. Such unfulfilled need is met by the present invention as will be made apparent from the following description thereof. Other advantages of the present invention over the prior art also will be rendered evident.

SUMMARY OF THE INVENTION

To achieve the foregoing and other advantages, the present invention, briefly described, provides an audio speaker in a cabinet having an internal baffle movable on a track and driven by a motor. The movement of the internal baffle is controlled externally by controls mounted on the speaker cabinet. Selective movement of the internal baffle results in a change of the resonant frequency of the speaker/cabinet combination thereby selectively changing the characteristic of the reproduced sound.

The above brief description sets forth rather broadly the more important features of the present invention in order that the detailed description thereof that follows may be better understood, and in order that the present contributions to the art may be better appreciated. There are, of course, additional features of the invention that will be described hereinafter and which will form the subject matter of the claims appended hereto.

In this respect, before explaining a preferred embodiment of the invention in detail as required by statute, it will be understood that the invention is not to be limited in its application to the details of the construction and to the arrangements of the components set forth in the following description or illustrated in the drawings. The invention is capable of other embodiments and of being practiced and carried out in various ways. Also, it is to be understood, that the phraseology and terminology employed herein are for the purpose of description and should not be regarded as limiting.

As such, those skilled in the art will appreciate that the conception, upon which this disclosure is based, may readily be utilized as a basis for designing other structures, methods, and systems for carrying out the several purposes of the present invention. It is important, therefore, that the claims be regarded as including such equivalent constructions insofar as they do not depart from the spirit and scope of the present invention.

Further, the purpose of the foregoing Abstract is to enable the U.S. Patent and Trademark Office and the public generally, and especially the scientists, engineers and practitioners in the art who are not familiar with patent or legal terms of phraseology, to determine quickly from a cursory inspection the nature and essence of the technical disclosure of the application. Accordingly, the Abstract is neither intended to define the invention or the application, which only is measured by the claims, nor is it intended to be limiting as to the scope of the invention in any way.

It is therefore an object of the present invention to provide a new and improved speaker with motor-driven internal baffle which has all of the advantages of the prior art and none of the disadvantages.

It is another object of the present invention to provide a new and improved speaker with motor-driven internal baffle which may be easily and efficiently manufactured and marketed.

It is a further objective of the present invention to provide a new and improved speaker with motor-driven internal baffle which is of durable and reliable construction.

An even further object of the present invention is to provide a new and improved speaker with motor-driven internal baffle which is susceptible of a low cost of manufacture with regard to both materials and labor, and which accordingly is then susceptible of low prices of sale to the consuming public, thereby making such improved speaker apparatus available to the buying public.

Still yet a further object of the present invention is to provide a new and improved speaker apparatus including means for selectively changing the resonant frequency of the speaker and its associated cabinet.

It is still a further object of the present invention to provide a new and improved speaker with a motor-driven internal baffle wherein the motor is controlled selectively and externally of the speaker.

Still a further object of the present invention is to provide a new and improved speaker with motor-driven internal baffle wherein movement of the baffle results in a change in the resonant frequency of the speaker and its cabinet thereby changing the character of the sound reproduced thereby.

These together with still other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there are illustrated preferred embodiments of the invention.

BRIEF DESCRIPTION OF THE DRAWINGS

The invention will be better understood and the above objects as well as objects other than those set forth above will become more apparent after a study of the following detailed description thereof. Such description makes reference to the annexed drawings wherein:

FIG. 3 is a cross-sectional view of a portion of the speaker cabinet of the invention showing the mounting of a motor-driven baffle on the inside wall thereof.

FIG. 4 is a bottom view taken along line 4—4 of FIG. 3.

DESCRIPTION OF THE PREFERRED EMBODIMENT

With reference now to the drawings, a new and improved speaker with motor-driven internal baffle embodying the principles and concepts of the present invention will be described.

Figure 1:
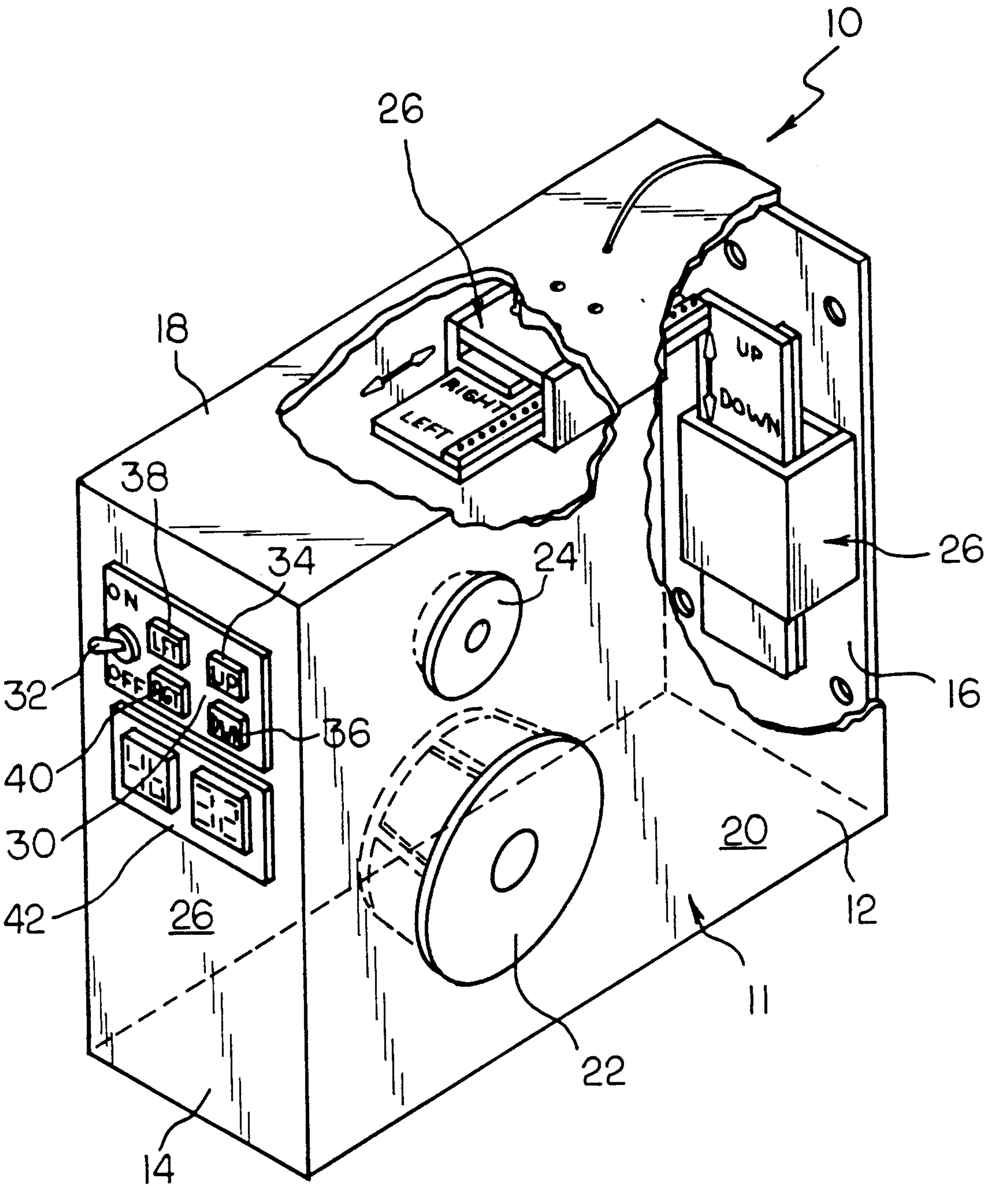
FIG. 1 is a perspective view showing the preferred embodiment of the speaker with motor-driven internal baffle according to the invention.

Turning initially to FIG. 1, there is shown an exemplary embodiment of the invention generally designated by reference numeral 10. In its preferred form, speaker apparatus 10 comprises generally a rectangular shaped cabinet or speaker enclosure 11 having a front wall 12, opposed side walls 14, 16, a top wall 18, a bottom wall 20, and a rear wall 21. A pair of conventional cone-type audio speakers or drivers are mounted in front wall 12 schematically as shown with speaker 22 being used to reproduce low frequencies in the audio spectrum (i.e. a "woofer"), and speaker 24 being used to reproduce higher frequencies (i.e. a "tweeter"). It will be appreciated that the details of the particular speaker units used in the cabinet or enclosure form no part of the present invention. Thus, the power leads, frequency dividing networks, terminal posts, and so on for powering or transmitting sound information electrical signals to these speakers have not been shown. These parts are well known and understood and all that is necessary for a full and complete understanding of the present invention is the realization that whatever conventional speaker units are used in or with cabinet 11 (for example, a single full-range speaker may be used instead of the two-way speaker arrangement shown), the characteristics of the speakers, and the internal volume of the cabinet will primarily determine the natural resonant frequency of the speaker/cabinet configuration.

In accordance with the principles of the invention, means are provide for selectively varying the natural resonant frequency of the speaker system 10. Such means, in their preferred form comprises a pair of movable, motor-driven baffle units mounted inside speaker cabinet 11 with each baffle unit being generally designated by reference numeral 26. In order to control the movement of the baffles which normally are inaccessible inside the sealed cabinet 11, an external control panel 30 is provided on side wall 14 having an on-off toggle switch 32 for controlling electrical power to the motor units, and separate push-buttons 34, 36, 38 and 40 for controlling the magnitude and direction of movement of each baffle. A suitable electrical conductor (not shown) connected to rear panel 21 provides electrical power from a conventional wall receptacle to the motor drive circuit suitably located inside cabinet 11 as will be further explained below. Finally, located adjacent control panel 30 is a liquid-crystal display unit 42 for indicating the relative position of each baffle before, during and after movement commands are entered into the system via push buttons 34–40.

Figure 2:
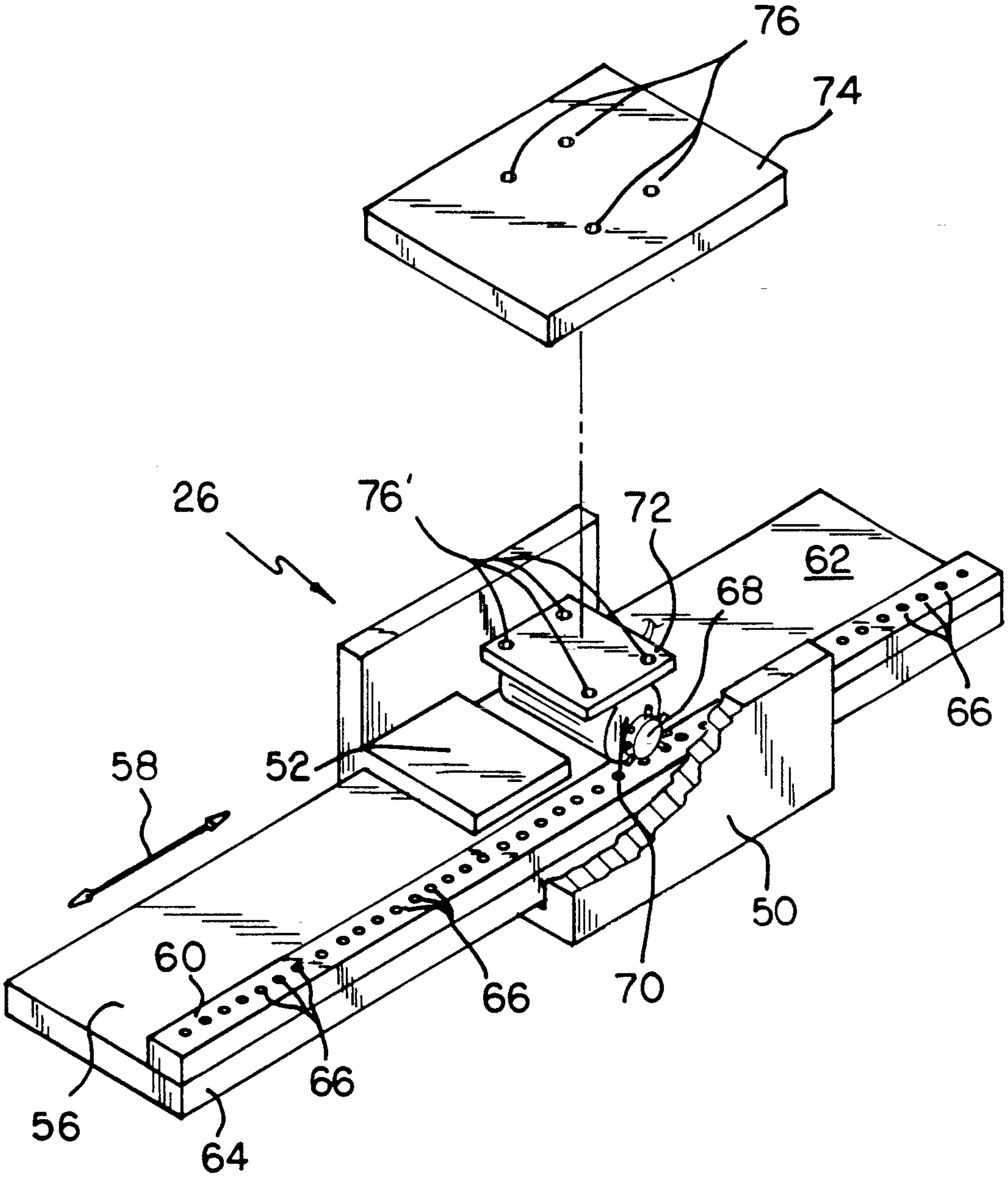
FIG. 2 is a perspective view of a motor-driven baffle sub-assembly of the preferred embodiment of FIG. 1.
Figure 5:
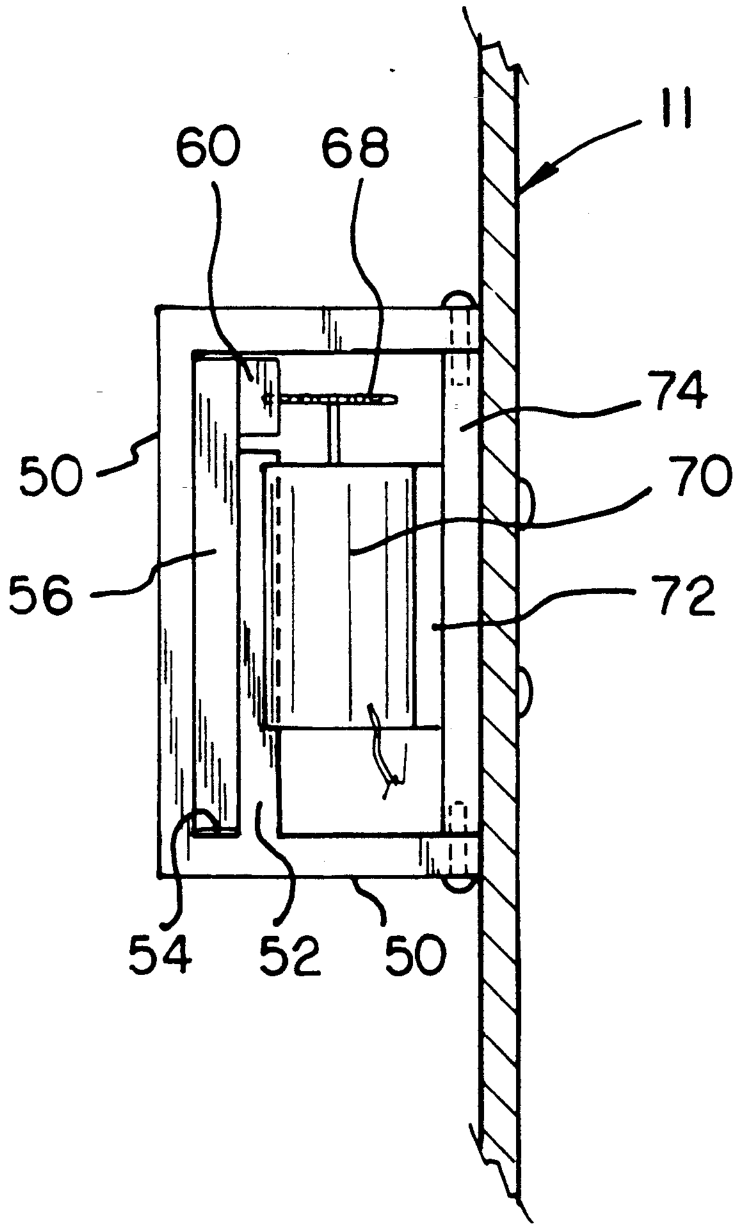
FIG. 5 is a side view taken along line 5—5 of FIG. 4.

Turning to FIGS. 2 through 5, each motor-driven baffle unit 26 comprises a generally U-shaped supporting frame 50 having a cantilevered partition 52 extending from one sidewall of the frame substantially as shown. The cantilevered partition defines a passageway 54 through which a rectangular shaped baffle element 56 moves along a path of travel indicated by arrow 58 (FIG. 2). Baffle element 56 includes a narrow rectangular ledge 60 suitably affixed to the baffle top surface 62 parallel and adjacent the longitudinal side edge 64 of the baffle opposite to the wall of frame 50 from which partition 52 is cantilevered. Ledge 60 has disposed therein a row of spaced holes each designated by reference numeral 66 extending the full longitudinal extent of the baffle substantially as shown. Engaging the holes 66 in ledge 60 are the sprockets of sprocket gear 68 affixed to the output shaft of an electrical motor 70 which latter has an integral mounting bracket 72 having suitable holes therein for receiving conventional screw fasteners or the like to affix the motor to a flat mounting plate 74 having a series of holes therein each designated by reference numeral 76. Mounting holes 76 preferably are aligned with the holes 76' in motor mounting bracket 72 so that the motor and the mounting plate may be affixed to an inside wall surface of cabinet 11 using the same mounting fasteners as depicted, for example, in FIG. 5. By the same token, U-shaped frame 50 may be attached to the opposite side edges of the mounting plate 74 using suitable fasteners as is also shown in FIG. 5.

By the arrangement shown, rotation of the output shaft of motor 70 causes the sprocket wheel 68 meshing with holes 66 in ledge 60 to drive (move) the baffle element 56 in the direction of arrow 58. Circuit means are provided for selectively providing input signals to motor 70 which signals are effective to determine the magnitude and direction of rotation of the motor's output shaft and therefore the direction and movement longitudinally of the baffle element relative to frame 50.

Figure 6:
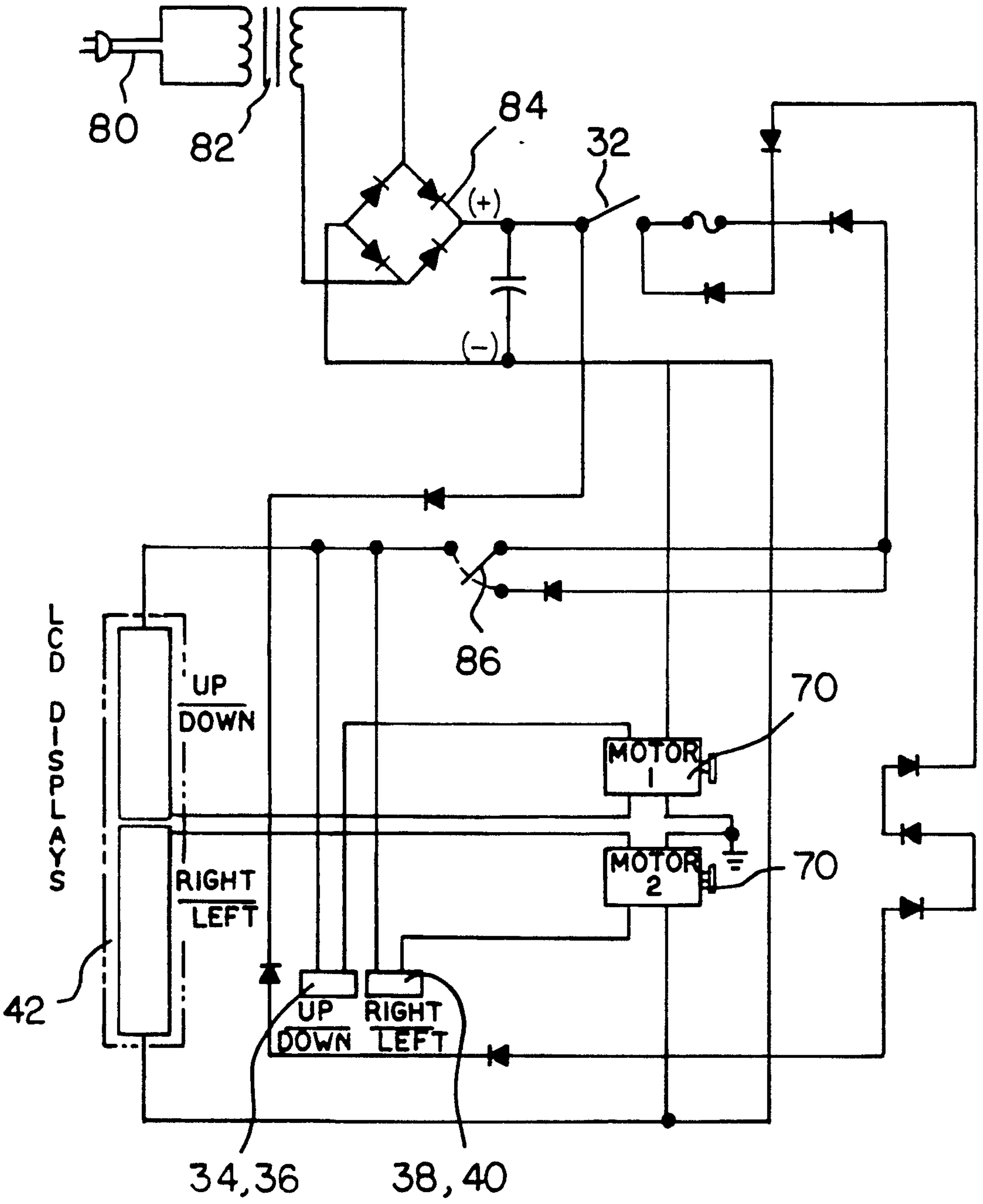
FIG. 6 is an electrical schematic diagram of the baffle motor drive circuit of the present invention.

Turning to FIG. 6, the preferred electrical circuit for controlling the baffle drive motors will now be described. An electrical conductor 80 applies conventional 110 Volt current to transformer 84 which steps the voltage down to about 9 volts and applies the transformer output across a full wave rectifier bridge 86 to produce a low voltage (e.g. 9 volts) direct current across the motor control branches of the circuit. Thus, when switch 32 is closed power is available to motors 70, UP/DOWN switches 34,36 and RIGHT/LEFT switches 38,40 and LED counter 42. Switch 86 is a directional switch and controls the application of power across the coils of motors 70 in the appropriate direction depending upon which of switches 34–40 is actuated. Thus, actuation of these switches will control the direction of movement of the output shaft of motors 70. These switches will also cause LED counter 42 to count the duration each switch is depressed which will determine the extent of each motor output shaft rotation. Hence, the number appearing at each motor/switch LED will indicate the relative movement of the output shaft from a zero position representing the limit of travel of each baffle. For example, when the LED corresponding to the UP/DOWN reads zero, the baffle is in the full down position and when the LED reads 99 the baffle is in the full up position. The circuit will function similarly with respect to the RIGHT/LEFT LED. Although not shown, suitable limit switches may be placed at the longitudinal extremities of the baffle to interrupt power to each motor circuit as is believe apparent to the routineer.

From the above, it is believed apparent that the present invention contemplates the provision of moveable baffles inside a speaker cabinet wherein each baffle may be moved to a position between two extremes and stopped anywhere in between. By moving one or both of the baffles relative to each other and the cabinet, adjustments to the resonant frequency of the speaker/-cabinet system may be effected. In the preferred embodiment, two such baffle unit are employed orthogonally related to each other substantially as shown. Hence, movement of the baffles toward each other will cause the top edge of one baffle to approach the right edge of the other baffle, in effect causing the formation of a right-angle corner in the cabinet. The arrangement of such an internal corner erected by moveable baffles will have a maximum effect in raising the natural resonant frequency of the cabinet and will accordingly, have maximum effect on the character of the sound emitted by the speaker system. Of course, the baffles may be moved anywhere up to and including the formation of the internal corner referred to above as desired by the listener and as determined by the impact such movement has on the reproduced sound in accordance with the personal preference of that listener.

Although the preferred embodiment includes a pair of motor driven baffles orthogonally mounted inside a speaker cabinet so that maximum movement of both baffles creates a right angle corner inside the speaker cabinet, it will be understood that more or less motor-driven baffles may be employed without departing from the principles of the invention. For example, a single motor driven baffle may be employed arranged to open and close an auxiliary chamber or series of chambers inside the speaker cabinet with the auxiliary chamber(s) being sealed off from the primary cavity of the speaker cabinet in the zero position of the baffle and the auxiliary chamber(s) being open to enlarge the primary cavity in the maximum displacement condition of the baffle, or anywhere in between these two extremes.

It is apparent from the above that the present invention accomplishes all of the objectives set forth by providing a new and improved speaker system with a motor-driven internal baffle wherein movement of the baffle results in a change in the resonant frequency of the speaker and its cabinet thereby changing the character of the sound reproduced thereby.

With respect to the above description, it should be realized that the optimum dimensional relationships for the parts of the invention, to include variations in size, materials, shape, form, function and manner of operation, assembly and use, are deemed readily apparent and obvious to those skilled in the art, and therefore, all relationships equivalent to those illustrated in the drawings and described in the specification are intended to be encompassed only by the scope of appended claims.

While the present invention has been shown in the drawings and fully described above with particularity and detail in connection with what is presently deemed to be the most practical and preferred embodiment(s) of the invention, it will be apparent to those of ordinary skill in the art that many modifications thereof may be made without departing from the principles and concepts set forth herein. Hence, the proper scope of the present invention should be determined only by the broadest interpretation of the appended claims so as encompass all such modifications and equivalents.

What is claimed as being new and desired to be protected by Letters Patent of the United States is as follows:

1. A new and improved speaker apparatus comprising:

an enclosure defining a chamber, said enclosure having at least one pair of orthogonally related intersecting walls forming a corner thereof, speaker means mounted in a portion of said enclosure and adapted to radiate sound outwardly of said enclosure, baffle means mounted on an inside surface of said enclosure, means for moving said baffle means relative to said inside surface of said enclosure between first and second positions, and manually activatable control means coupled to said means for moving mounted outside said enclosure whereby said baffle means may be caused to move between said first and second positions to selectively alter the resonant frequency of said speaker system, wherein said baffle means comprises a pair of motor-driven baffle elements orthogonally supported relative to each other inside said enclosure adjacent said at least pair of intersecting walls, respectively, and wherein said control means includes means for causing said motor-driven baffle elements to travel toward each other independently and form a corner inside said enclosure adjacent said corner formed by said at least pair of orthogonally related intersecting walls.

2. The invention of claim 1 wherein said motor-driven baffle elements further comprises a motor, each said baffle element being driven in a path of travel by said motor, said path extending between said first and second positions.

3. The invention of claim 2 wherein said baffle element further comprises a frame, said baffle element being supported on said frame for relative movement thereto between said first and second positions, said motor being associated with said frame and including means for engaging said baffle element.

4. The invention of claim 3 wherein said baffle element further comprises a series of spaced holes thereon, and said means for engaging includes a sprocket gear attached to said motor.

5. The invention of claim 4 wherein said baffle element comprises a rectangular plate having a pair of opposed longitudinally extending sides, and said series of spaced holes is located proximally and parallel to one of said sides.

6. The invention of claim 1 wherein said control means includes means for indicating the extent and direction of said baffle means.

* * * * *